United States Patent [19]

Delaporte et al.

[11] 4,164,668

[45] Aug. 14, 1979

[54] METHOD OF CORRECTING THE VOLTAGE COEFFICIENT OF RESISTORS IMPLANTED OR DIFFUSED IN A SEMICONDUCTOR SUBSTRATE

[75] Inventors: Francois X. Delaporte, Cagnes sur Mer; Robert M. Hornung, Evry; Anne-Marie Lamouroux, Prades; Gerard M. Lebesnerais, Ponthierry; Jean-Paul J. Nuez, Mennecy, all of France

[73] Assignee: International Business Machines Corporation, Armonk, N.Y.

[21] Appl. No.: 796,266

[22] Filed: May 12, 1977

[51] Int. Cl.$^2$ ............................................. H01L 27/04
[52] U.S. Cl. ..................................... 307/303; 323/80; 357/22; 357/48; 357/51
[58] Field of Search ........................ 357/22, 48, 51, 91; 307/303, 304

[56] References Cited

U.S. PATENT DOCUMENTS

| | | | |
|---|---|---|---|
| 3,796,929 | 3/1974 | Nicholas et al. | 357/51 |
| 3,829,709 | 8/1974 | Maigret et al. | 307/303 |
| 3,990,092 | 11/1976 | Yoshimura | 357/51 |
| 4,034,395 | 7/1977 | Abdelrahman | 357/51 |
| 4,044,371 | 8/1977 | Abdelrahman et al. | 357/51 |
| 4,079,337 | 3/1978 | Lundgren et al. | 357/51 |

OTHER PUBLICATIONS

Lin, Integrated Electronics, Holden–Day Pub. Co., San Francisco, 1967, pp. 16–19, 194–199.

*Primary Examiner*—William D. Larkins
*Attorney, Agent, or Firm*—Martin G. Reiffin; George O. Saile

[57] ABSTRACT

A method and structure for correcting the voltage coefficient of resistance (VCR) of a resistor in a semiconductor body is described. The resistor may be diffused or ion implanted of one conductivity and formed in an isolated layer of the opposite type of conductivity. The layer is typically an epitaxial layer. A potential $V_1$ is applied to one end of the resistor and a potential $V_2$ being applied to the opposite end. The method provides means for controlling variations of the potential difference between the resistive region and the epitaxial layer, either to minimize them or to cause the distortions generated by such variations to be compensated for by equal distortions of opposite directions, such that the overall distortion will be equal to zero. There is provided means to cause the potential of the epitaxial layer to reach a suitable value, preferably a value that varies in the same manner as the average value of the resistor whose VCR is to be corrected.

4 Claims, 11 Drawing Figures

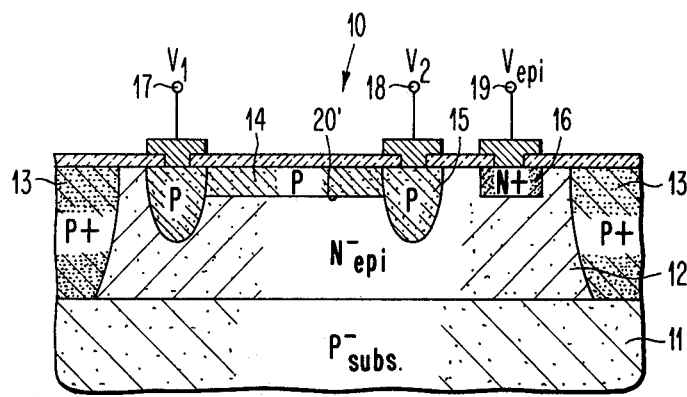
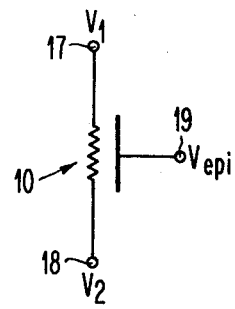
FIG. 1A      FIG. 1B
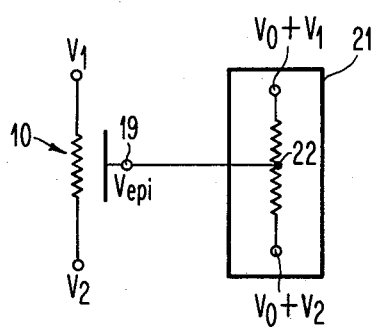
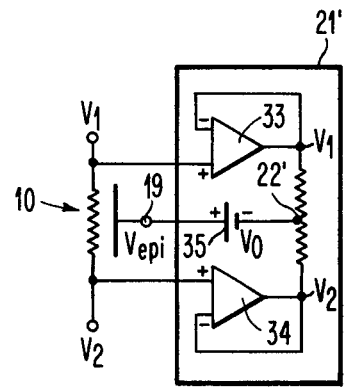
FIG. 2      FIG. 3A
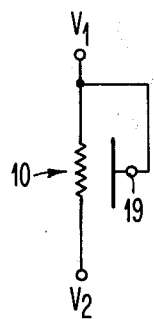    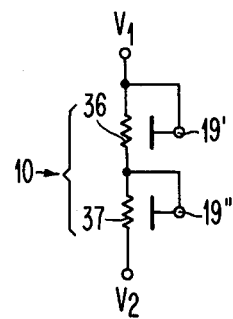    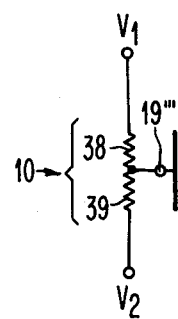
FIG. 3B    FIG. 3C    FIG. 3D

METHOD OF CORRECTING THE VOLTAGE COEFFICIENT OF RESISTORS IMPLANTED OR DIFFUSED IN A SEMICONDUCTOR SUBSTRATE

BACKGROUND OF THE INVENTION

This invention relates to the field of resistors formed by diffusion or ion implantation in a single crystal semiconductor substrate typically of silicon and, more particularly, to a method of correcting the voltage coefficient of resistance (VCR) in implanted resistors.

DESCRIPTION OF THE PRIOR ART

Circuit designers are relying more and more heavily on the use of integrated circuit structures. These structures have developed at a rapid pace in recent years as a result of the many improvements made in the basic active and/or passive components. Besides the active components, especially the resistors, keep playing an essential part in many applications and more particularly in applications involving analog circuits. Two technologies can be used to associate resistors with the active components in integrated circuits: one of these is the compatible hybrid technology wherein resistors are deposited in the form of thin films on the surface of an integrated semiconductor chip; the other is the monolithic technology in which the resistors are formed within the semiconductor chip itself in the same manner as the active components. In the latter case, the resistors can be formed either by thermal diffusion or by ion implantation.

The body of a thin film resistor generally consists of a metal such as nickel-chromium alloy or tantalum. Resistors of this type offer a number of advantages, including sheet resistance values ranging from 200 to 10,000 $\Omega/\square$ and a relatively low temperature coefficient of resistance (or TCR), of the order of 3% between 0° and 75° C. However, they also have major disadvantages, one of these being the fact that they require additional processing steps (vacuum deposition, cathode sputtering, etc.) that are frequently incompatible with the methods used to form the semiconductor chip itself, thereby adversely affecting the chip yield. Monolithic circuit manufacturers therefore consider this technology relatively unattractive for the purposes of a large-scale, low cost production. The monolithic technology appears to be the most desirable solution.

Diffused resistors are well known in the art. These resistors are generally formed during the diffusion step of the base or emitter region of bipolar transistors. Conventionally, a P type base region is diffused in a N-type epitaxial layer which overlays a P-type single-crystal silicon substrate. The value of the resistor depends upon a number of parameters such as the profile and depth of the diffusions, the length-to-width ratio of the diffused zone, etc. Two ohmic contacts are formed at the ends of the diffused region and constitute the output terminals of the resistor. The most positive potential of the circuit is generally applied to that portion of the epitaxial layer which is located within the isolation pocket, which includes the resistive region. The limitations of such resistors are their low sheet resistance (400 $\Omega/\square$), the low accuracy of their nominal value ($\pm 20\%$) and their high temperature coefficient (of the order of 2000 ppm/°C.), resulting in a significant variation of the resistance as a function of temperature between 25° and 75° C.). On the other hand, the method of forming such resistors is well known and relatively simple to use.

Implanted resistors are a particularly interesting alternative to diffused resistors and offer significant advantages over the latter. In particular, boron implanted resistors exhibiting a wide range of sheet resistance values (3 to 10,000 $\Omega/\square$ and over) and a low sensitivity to temperature (resistance variation of 0.5% between 0° and 75° C.) can be obtained. In addition, such resistors are relatively accurate ($\pm 2\%$). This type of device is discussed in an article by K. Rosendal entitled "Ion Implanted Planar Resistors", in Radiation Effects, Vol. 7, pp. 95–100, Nos. 1 and 2, Jan. 1971.

A comparative study of the three types of resistors mentioned above may be found in an article by H. H. Stellrecht entitled "Precision Ladder Networks Using Ion Implanted Resistors", in Wescon Technical Papers, Vol. 15, ref. 8080-28/2, 1971, and in an article by J. Den Boer et al entitled "The Thermal Properties of High Value Gallium and Boron Implanted Resistors in Silicon", appearing in European Conference on Ion Implantation, Sept. 7–9, 1970.

However, a problem to which little attention has been paid until now, namely, the variation of the resistance value as a function of the voltage applied across the resistor, seems to assume a growing importance. The I-V characteristic of a resistor should normally be linear. Actually, this only holds true in respect of implanted resistors exhibiting a low sheet resistance, of the order of a few hundred ohms/$\square$, as it appears from an article by John McDougall et al entitled "High Value Implanted Resistors For Microcircuits", appearing in Proceedings of the IEEE, Vol. 57, No. 9, page 1540, Sept. 1969, and more particularly from FIG. 5 of said article. If high value implanted resisters that require high sheet resistance values (e.g. 20K$\Omega/\square$) are desired, the I-V characteristic becomes nonlinear and slopes downwards, causing the response of the resistor to an input signal to be distorted. This shows that the actual value of the resistor at a given voltage is higher than expected. The I-V characteristic is then in every way similar to that of a junction field effect transistor (JFET). It should be clearly understood that the value of the resistor is primarily a function of the voltage applied to the junction between the resistive region and the epitaxial layer. This value is to some extent related to the voltage $V_R$ across the resistor. The distortion is due to the fact that the depletion layer, located on both sides of the PN junction and devoid of charge carriers, tends to become wider as the voltage applied to the PN junction increases, thereby reducing the effective cross-section of the resistor and ultimately increasing its value. This is the well known problem of the pinch-off voltage which is associated, in particular, with the JFETs, but is more critical in respect of implanted resistors than of diffused resistors since implanted resistors generally exhibit higher resistivities and are consequently thinner.

A first solution is proposed in the article by John McDougall cited above and consists in increasing the resistivity of the epitaxial layer to achieve values higher than 100 ohms cm. However, this can adversely affect some electrical parameters of adjacent active devices.

An obvious alternative would be to limit the development of the depletion layer within the resistive region so as to increase, as we have seen, the nominal value of the resistor. This can be achieved by increasing the ion dose, as described in an article by J. W. Hanson entitled "Ion Implanted N Type Resistors on Hig Resistivity Substrates", in J. Vac. Sci. Tech., Vol. 10, No. 6, Nov.–Dec. 1973, and more particularly as illustrated in FIG. 6 of said article.

Still another solution is proposed in French Pat. No. 71 44222 issued to Philips. Although no specific reference to the VCR is made therein, it would seem that correction of the VCR can be achieved by implanting neutral ions in the resistive region, preferably in the vicinity of the PN junction. These crystal defect generating ions have the property of improving the linearity of the I-V characteristic of the resistor. In this regard, more particular reference should be made to FIG. 7 of said patent. The main disadvantage of this method is that it requires an additional process step.

SUMMARY OF THE PRESENT INVENTION

Accordingly, it is an object of the present invention to provide means for correcting the VCR of implanted resistors that allow the use of epitaxial layers exhibiting relatively low resistivities.

Another object of this invention is to provide an implanted resistor the value of which remains perfectly constant regardless of the voltage applied to the junction between the resistive region and the epitaxial layer.

Still another object of this invention is to provide means for correcting the VCR of implanted resistors that require no additional process steps.

This invention describes a method of correcting the VCR of a resistor implanted in a semiconductor body, said resistor consisting of a region of a suitable type of conductivity formed in an isolated epitaxial layer of the opposite type of conductivity, a potential $V_1$ being applied to one end of the resistor and a potential $V_2$ being applied to the opposite end. In its more general aspect, the method of the present invention provides means for controlling variations of the potential difference between the resistive region and the epitaxial layer, either to minimize them or to cause the distortions generated by such variations to be compensated for by equal distortions of opposite directions, such that the overall distortion will be equal to zero. According to a more particular aspect of the invention, this method is characterized in that means are provided to cause the potential of said epitaxial layer to reach a suitable value, preferably a value that varies in the same manner as the average value of the resistor whose VCR is to be corrected. In other words, if the average value of the potential difference between the body of the resistor and the epitaxial layer remains constant along the length of the resistor, then the value of the resistor will remain constant and the distortion will be negligible. In practice, in a preferred embodiment of the invention, the potential to be applied to the epitaxial layer to correct the VCR takes the form $$V_{epi} = \tfrac{1}{2}(V_1 + V_2) + V_o$$

where $V_o$ is a constant, as shall be seen hereafter. This amounts to applying to the epitaxial layer the average potential of the resistor whose VCR is to be corrected, plus a constant.

The value of the resistor is written $$R = R_o(l + \lambda V_{eff})$$

where
$\lambda$ is the VCR, and $V_{eff}$ is a coefficient an approximate value of which is given by the empirical expression $$V_{eff} = V_{epi} - V_{RP} + k(V_1 - V_2)$$

where
$V_{epi}$ is the potential of the epitaxial layer,
$V_{RP}$ is the most positive voltage across the resistor,
$V_1 - V_2$) is the voltage drop across the resistor, and,
k is a coefficient that depends, among other factors, on the sheet resistance of the epitaxial layer and of the region used as resistor or resistive region; the value of this coefficient is generally close to 0.5.

With this particular value of $V_{epi}$, the value of $V_{eff}$ will be constant and, in particular, independent of the potential across the resistor: $V_R = V_1 - V_2$.

The foregoing and other objects, features and advantages of the invention will be apparent from the following more particular description of a preferred embodiment of the invention, as illustrated in the accompanying drawings.

BRIEF DESCRIPTION OF THE DRAWINGS

FIG. 1A is a cross-sectional view of a typical ion implanted resistor and FIG. 1B shows its equivalent electrical diagram.

FIG. 2 is a schematic illustration of a first embodiment of the invention wherein the correction means are independent of the ion implanted resistor whose VCR is to be corrected.

FIGS. 3A–3D illustrate other embodiments of the invention wherein the correction means are dependent on the implanted resistor whose VCR is to be corrected.

DETAILED DESCRIPTION OF THE INVENTION

Figure 4:
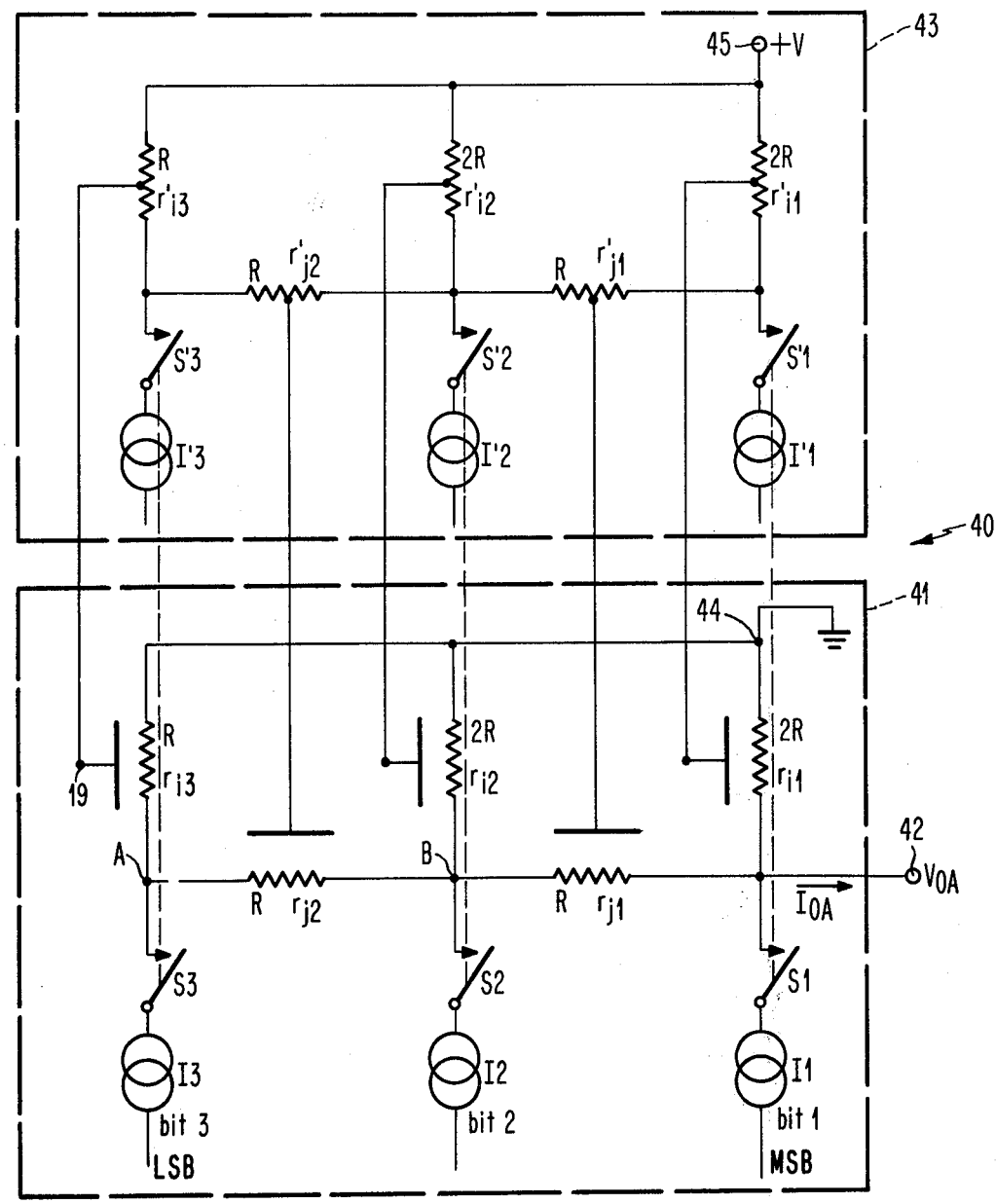
FIG. 4 shows the manner in which the first embodiment of the invention can be used to correct the VCR in a digital-to-analog converter comprising a compensation network independent of the network whose VCR is to be corrected and substantially identical therewith.

Referring now more particularly to FIG. 1A, a conventional monolithic integrated resistor structure 10 is shown. An epitaxial layer 12, relatively thin (its thickness being of the order of a few microns) and lightly doped (average resistivity: 1 ohm-cm), is grown on a single-crystal semiconductor substrate typically of silicon 11 of a first type of conductivity, for example P-. In this layer, of a conductivity type opposite to that of the substrate, an isolated pocket is defined, for example, by heavily doped isolation walls 13, which are of the first type of conductivity and extend to the surface of the substrate. An elongated region 14 intended to serve as a resistive region is then formed by ion implantation of an impurity of the first type of conductivity. Actually, the latter step is generally carried out after two P type contact areas (shown at 15) have been formed concurrently with the diffusion of the base regions of the bipolar transistors. These contact areas, which are fairly heavily doped relative to the resistive region proper, assure that the value of the resistor defined by resistive region 14 will only be determined by the sheet resistance. A second region 16, heavily doped and of the second type of conductivity, is generally formed concurrently with the emitter regions of said bipolar transistors to serve as contact area for the epitaxial layer. Two ohmic contacts to the resistor are formed; these are shown at 17 and 18. The second region is also provided with an ohmic contact, shown at 19. The problems associated with the manufacturing of implanted resistors are well known in the art. Detailed descriptions of manufacturing processes are readily available. In this regard, U.S. Pat. No. 3,902,926 is of particular significance. Further reference may also be made to the article by J. Den Boer mentioned above. Potentials $V_1$ and $V_2$ are applied to ohmic contacts 17 and 18, respectively. Ohmic contact 19, which serves to make contact to the epitaxial layer, may be left unconnected (floating epitaxial layer), which is generally undesirable, or, alternatively, may be connected to a suitable potential source, while the most negative potential of the circuit is applied to the substrate so as to reverse bias the PN junction 20 between the isolation wall and the substrate on the one hand, and the epitaxial layer, on the other hand. This reverse bias assures the electrical isolation of the pocket thus defined. If preferred, the most positive potential of the circuit may be connected to contact 19, thereby ensuring the electrical isolation of the resistive region relative to the epitaxial layer. The latter arrangement is required if several resistors are to be formed in the same epitaxial pocket. Thus, in all cases, ohmic contact 19 permits a desired potential to be applied to the epitaxial layer.

FIG. 1B shows the electrical diagram for implanted resistor 10. Elements of this diagram which are like elements of the FIG. 1A cross-sectional view are given the same reference numerals. The value R of resistor 10 can be expressed as:

$$R = R_0(1 + \lambda V_{eff}) \quad (1)$$

where
  $R_0$ is the intrinsic value of the resistor as determined from the nature and the size of the semiconductor material involved,
  $\lambda$ is the VCR, and
  $V_{eff}$ can be approximated using the empirical expression:

$$V_{eff} = V_{epi} - V_{RP} + kV_R \quad (2)$$

where
  $V_{epi}$ is the potential applied to the epitaxial layer,
  $V_{RP}$ is the value of the most positive potential across the resistor (in this example, it is assumed that $V_{RP} = V_1$),
  $V_R$ is the potential drop across the resistor, i.e., $V_R = V_1 - V_2$ ($V_1$ and $V_2$ being two essentially variable potentials), and
  k is a coefficient which is essentially dependent upon the sheet resistance of the resistive region; it has been demonstrated experimentally that the value of k varies between 0.4 and 0.6. An approximate value of 0.5 can be used. $V_{eff}$ and therefore the value R of the resistor are a function of essentially variable potentials $V_1$ and $V_2$.

If $V_{eff}$ is a constant, R will be independent of applied potentials $V_1$ and $V_2$. Such a result can be obtained by applying to the epitaxial layer containing the resistor whose VCR is to be corrected, a potential which obeys the general expression $$V_{epi} = \tfrac{1}{2}(V_1 + V_2) + V_0 \quad (3)$$

$V_0$ is the voltage required to reverse bias the PN junction 20' formed between the P type resistive region and the N type epitaxial layer, on the one hand, and junction 20, on the other hand, as previously mentioned. Substituting $V_{epi}$ as defined in Eq. (3) $V_{RP} = V_1$, and k=0.5 into Eq. (2) gives:

$$V_{eff} = \tfrac{1}{2}(V_1 + V_2) + V_0 - V_1 + 0.5(V_1 - V_2)$$

and $$V_{eff} = V_0 \quad (4)$$

This shows that, with this particular value of $V_{epi}$, $V_{eff}$ becomes independent of $V_R$, the voltage applied across the resistor. The value R of the resistor is finally written:

$$R = R_0(1 + \lambda V_0) = hR_0 \quad (5)$$

where h is a constant independent of voltages $V_1$ and $V_2$.

The above calculation evidences the fact that the voltage to be applied to the epitaxial layer must obey expression (3). That is, the epitaxial layer must be connected to a voltage which varies in the same manner as the average voltage of the resistor whose VCR is to be corrected. This result could be achieved by providing the resistor with VCR correction means that would apply a potential of this form to the epitaxial layer. Since potentials $V_1$ and $V_2$ are applied across the resistor, two solutions are possible depending on whether or not the VCR correction means are independent of the resistor, and more particularly of the voltages across the resistor.

The first solution is illustrated by the first embodiment shown in FIG. 2 wherein correction means 21 are associated with the resistor 10 whose VCR is to be corrected. Means 21 are essentially comprised of a resistor 22 and biasing means $V_0$. In order for expression (3) to be verified, the voltage drop across resistor 22 must be equal to $V_R$. Voltages $V_0 + V_1$ and $V_0 + V_2$, i.e., a potential difference equal to $V_1 - V_2$, will therefore be applied across resistor 22. Accordingly, voltages $V_1$ and $V_2$ can either be obtained independently of the voltages $V_1$ and $V_2$ across the resistor whose VCR is to be corrected, or derived from the latter voltages by suitable electrical circuitry. In fact, all that is required in order for the VCR to be corrected is that a DC voltage of appropriate polarity be applied to one end of resistor 22. Resistor 22 is provided with an intermediate tap, for example a center tap (assuming that the approximate value of K is 0.5). Lastly, resistor 22 may be of off-chip component, or, preferably, a resistor implanted concurrently with resistor 10 but in a different isolation pocket.

The other solution is illustrated by the various embodiments shown in FIGS. 3A, 3B and 3D.

In the embodiment of FIG. 3A, the voltages across resistor 10 are applied to resistor 22' through a couple of amplifiers 33, 34, which may simply consist of emitter-follower transistors; these amplifiers have a voltage gain equal to unity and draw practically no current. Correction means 21' also include a DC voltage source 35 which supplies a voltage equal to $V_0$ and is connected between the center tap of resistor 22' and ohmic contact 19.

However, this embodiment presents some disadvantages that are mainly due to the presence of amplifiers 23 and 24, particularly a greater complexity and a reduction in speed.

A simplified embodiment is shown in FIG. 3B. As before, the object here is to reduce the variations in the potential difference between the resistive region and the epitaxial layer, but, contrary to the solutions illustrated in FIGS. 2 and 3A, the reduction is not optimized. As shown in FIG. 3B, ohmic contact 19 is connected to the most positive of voltages $V_1$ and $V_2$. In other words, one applies the voltage $V_{epi} = V_1$ instead of a voltage of the form $$V_{epi} = \tfrac{1}{2}(V_1 + V_2) + V_0,$$

Expression (2) then becomes, with $V_{RP} = V_1$ and $k = 0.5$ $$v_{eff} = 0.5\, V_R \tag{6}$$

and the value R of the resistor is no longer a constant as in expression (5) but is now defined by $$R = R_0(1 + \lambda(V/2)R) \tag{7}$$

R increases with the voltage applied across the resistor. In the latter case, the VCR correction achieved is only approximate. However, this solution is acceptable where the potential difference $V_R$ across the resistor is low and the value of $$\frac{V_1 + V_2}{2}$$

is high. The simplicity of this solution renders it attractive. In addition, it could advantageously be combined with the complementary VCR reduction means described below (FIG. 3C).

In the embodiment of FIG. 3C, the resistor 10 of value R has been divided into two portions 36 and 37 which are electrically isolated from each other and whose values may be, for example, identical. Resistor 36 has its ohmic contact 19' connected to voltage $V_1$ while resistor 37 has its ohmic contact 19" connected to voltage $$\frac{V_1 + V_2}{2}.$$

Let us now calculate the new value of resistor 10. As regards resistor 36 of value R', we may write:

$$V'_{eff} = .5\left(V_1 - \frac{V_1 + V_2}{2}\right) = .5\left(\frac{V_1 - V_2}{2}\right)$$

and $$R' = \frac{R_0}{2}\left(1 + \frac{\lambda}{2}\frac{V_R}{2}\right)$$

Similarly, we find for resistor 37 of value R":

$$V''_{eff} = .5\left(\frac{V_1 + V_2}{2} - V_2\right) = .5\left(\frac{V_1 - V_2}{2}\right)$$

and $$R'' = \frac{R_0}{2}\left(1 + \frac{\lambda}{2}\frac{V_R}{2}\right)$$

always with $V_R = V_1 - V_2$.

Hence $$R = R' + R'' = R_0\left(1 + \frac{\lambda}{2}\frac{V_R}{2}\right) \tag{8}$$

Comparing this value with that of the resistor shown in FIG. 3B, as given by expression (7), it will be seen that by dividing the resistor in two equal portions, the value of the coefficient of $V_R$, which is $\lambda$ or the VCR, can be halved. More generally, if the resistor R were divided into n equal portions, that if $$R = \sum_{1}^{n} R_i$$

the VCR would be divided by n. It should be noted that this technique can advantageously be applied to the embodiment of FIG. 2 as well as to that of FIG. 3A.

The embodiments of FIGS. 3B and 3C are interesting in relation to unipolar signals in which potential $V_1$ is always higher than potential $V_2$.

In the event of potential $V_1$ being positive and negative with respect to $V_2$ (as in the case of bipolar signals), the potential difference $V_1 - V_2 = V_R$ must be maintained at a very low level, equal to or lower than, say, a few hundred millivolts, so that the junction, which is then forward biased, between the implanted resistive region and the epitaxial layer will not conduct appreciably.

FIG. 3D illustrates another embodiment that is still more advantageous in the case of bipolar signals.

As shown, resistor 10 is provided with a center tap allowing the potential thereof to be applied to the ohmic contact 19''' associated with the epitaxial layer. This arrangement offers the following advantages as far as bipolar signals are concerned: (1) it is symmetrical with respect to the positive and negative half-cycles of the signal; (2) perfect VCR correction is obtained since we have $$V_{epi} = \frac{V_1 + V_2}{2}$$

as compared with the approximate correction provided by the embodiments of FIGS. 3B and 3C, and 3) the value of the voltage that can be applied is doubled.

In other words, perfect VCR correction is achieved in this case because the distortion caused by resistor 38 is compensated for by an equal but opposite distortion introduced by resistor 39.

Figure 5:
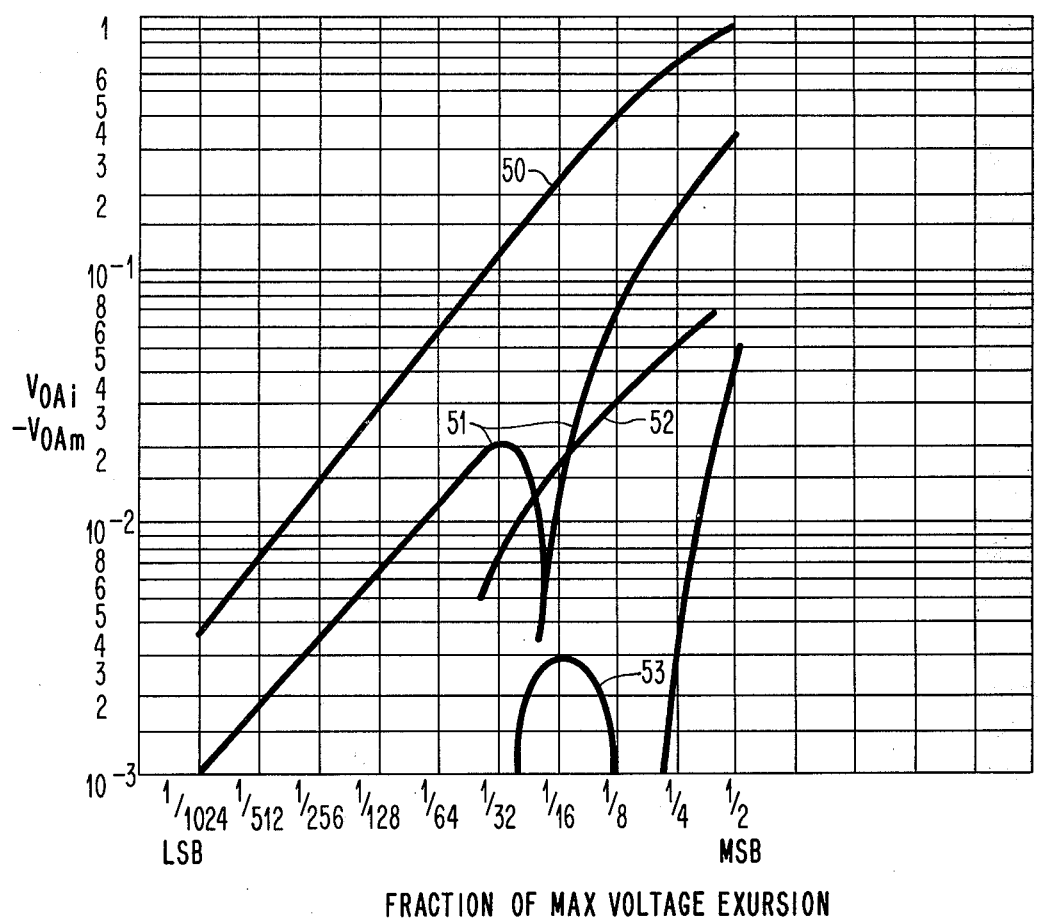
FIG. 5 shows the effects of the VCR correction on digital-to-analog converters of different capacities.
Figure 6A:
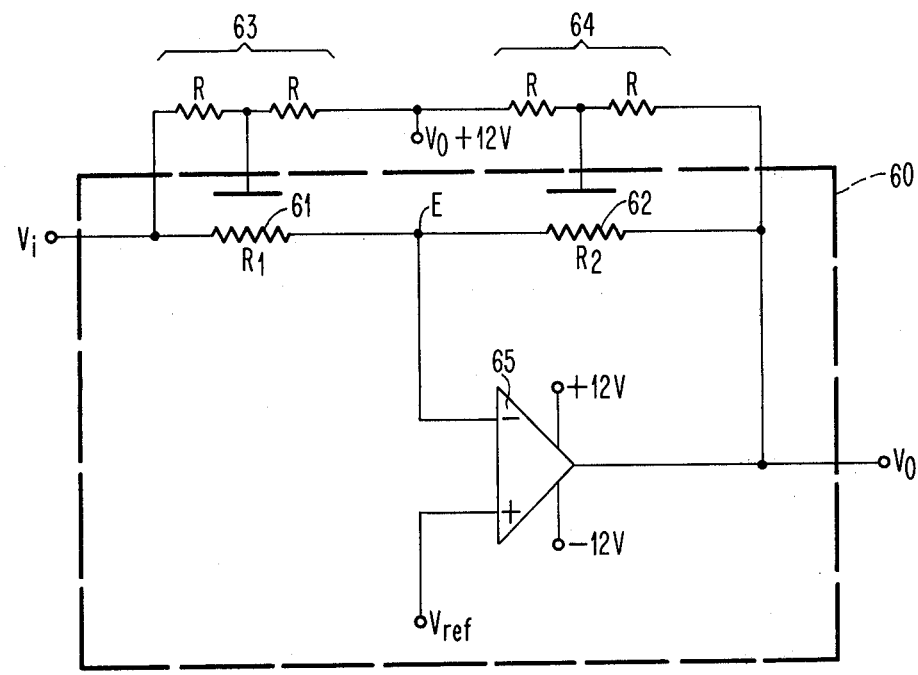
FIGS. 6A and 6B show the manner in which said other embodiments of the invention can be used to correct the VCR of implanted resistors in an operational amplifier.
Figure 6B:
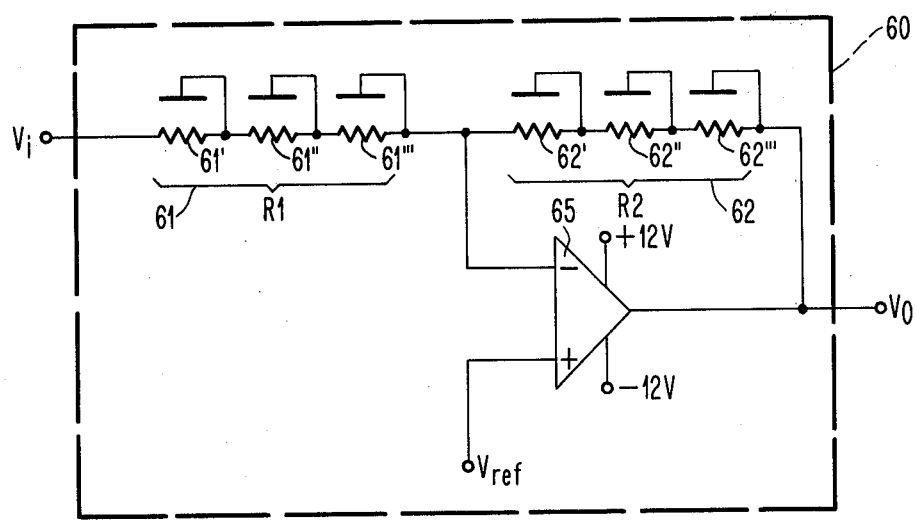

Specific applications are discussed below to make it easier to understand the teachings and the advantages of the present invention. A description will first be given of applications of the first embodiment to a digital-to-analog converter (FIGS. 4 and 5); applications of the other embodiments to an operational amplifier will then be described (FIGS. 6A and 6B).

FIG. 4 illustrates a couple of conventional, parallel-connected digital-to-analog converters (DACs) of the type wherein binary attenuation is achieved through the use of a R-2R ladder network. For simplicity, the number of stages of each converter has been limited to three; each DAC is therefore capable of processing $2^3$ three-bit combinations from 000 to 111. Such DACs offer significant advantages over DACs of the weighted current type: they are fast (switching time os 200ns), accurate (all current sources are identical), and take relatively little space on the semiconductor chip; on the other hand, there main disadvantage is that the linearity of their output is affected by the sensitivity to the VCR of the resistors in the R-2R ladder network where such resistors are ion-implanted. This is due to the fact that the sheet resistance of such ion-implanted resistors increases with the voltage drop across them, thereby producing distortions (nonlinearities) in the DAC output.

Both types of converter are discussed in an article by G. Kelson et al entitled "A Monolithic 10-Bit Digital-to-Analog Converter Using Ion Implantation", in the IEEE Journal of Solid-State Circuits, Vol. SC-8, No. 6, December 1973, page 396.

A typical value of the VCR in this case is 6400 ppm/V with the epitaxial layer voltage ranging from 1 to 5 volts. The VCR-corrected DAC 40 is in effect comprised of two identical DACs that use R-2R ladder networks. The first of these DACs, or main DAC, is shown at 41 together with its output terminal 42 while the second DAC, or VCR-correcting DAC, is shown at 43. The R-2R network of the main DAC is connected to the reference potential (terminal 44) and that of DAC 43 is connected to a source of positive DC voltage (terminal 45). This positive DC voltage will permit biasing the PN junctions such as 20 and 20' for each resistor in the R-2R ladder network of DAC 41.

Conventionally, main DAC 41 includes, in addition to the R-2R network, switches S1, S2, S3 which are in fact switching transistors controlled by the digital inputs (when the input bit is a "1", the switch is open; when it is a "0", the switch is closed), and current sources I1, I2, I3 supplying identical currents. The analog output current is thus weighted in accordance with the binary inputs. Each of resistors of the network, whether it is a column resistor such as $r_{ik}$ or a row resistor such as $r_{jk}$ (in the FIG. the numerals 1, 2, 3 denote the actual order of the respective devices), is electrically isolated from the other components by suitable means such as the isolation walls 13 of FIG. 1. The electrical contact with the epitaxial layer is, as before, designated 19. The structure and operation of this type of DAC are well known in the art; in this regard, reference may be made, for example, to the previously mentioned article by G. Kelson et al.

The R-2R network generates the weighted output current $i_{OA}$ which can subsequently be converted into an analog output voltage by means, for example of an operational amplifier (not shown).

The DAC 43 is structurally identical to the DAC 41 and is driven by current generators I'1, I'2, I'3 which verify, with the currents provided by DAC 41, the expression $I_i = I'_i$. The column and row resistors in the R-2R network are such that $r_{ik} = r'_{ik}$ and that $r_{jk} = r'_{jk}$. Current switches S'1, S'2, S'3 are driven simultaneously with switches S1, S2, S3; in other words, the same digital input is applied to both DACs 41 and 43.

In expression (2) above, a value of k=0.5 was selected as a first approximation. In this particular application, this value of k is the most advantageous from the standpoint of symmetry. As shown in FIG. 4, depending upon the binary input, the potential $V_A$ at point A can be higher or lower than potential $V_B$ at point B, making it necessary to divide resistors such as $r'_{jk}$ into two equal portions. Similarly, column resistors such as $r'_{ik}$ are divided into two equal portions so as not to affect the major carry. Ion implanted resistors $r'_{ik}$ and $r'_{jk}$ of value R or 2R are provided with center taps each of which can be connected to the ohmic contact 19 of the corresponding resistor $r_{ik}$ or $r_{jk}$ whose VCR is to be corrected. Thus, substantially the same potential difference is maintained between the epitaxial layer and each point of each resistor of DAC 41, thereby assuring that the expression $$V_{epi} = V_0 + \tfrac{1}{2}(V_1 + V_2)$$

is always verified.

The method of the present invention was applied to a high accuracy 10-bit digital-to-analog converter. The results obtained are illustrated in FIG. 5. The difference between the ideal output voltage $V_{OAi}$ and the measured output voltage $V_{OAm}$ is represented along the y-axis in fractions of LSB (least significant bit).

The maximum voltage excursion and fractions thereof are shown along the x-axis. The response curve of an uncorrected DAC is shown at 50. A marked improvement is obtained when VCR correction is applied to a 4-bit DAC (curve 51), to a 6-bit DAC (curve 52), or to a 10-bit DAC (curve 53). In the latter case, it is apparent that the VCR has been divided by about 10. The corrected bits always are the most significant bits (MSB). In the event of the VCR of a resistor not being corrected, the most positive potential (+V in FIG. 4) will be applied to its epitaxial layer.

FIGS. 6A and 6B show the manner in which the other embodiments of the invention can be used to correct the VCR of two ion-implanted resistors R1 and R2, designated 61 and 62, respectively, in a linear amplifier.

Referring first to FIG. 6A, resistors 63 and 64, the values of which are much higher than those of R1 and R2, are used so that the current drift in resistors 63 and 64 will be negligible. The operational amplifier proper is shown at 65. A potential difference $V_i$ is applied across resistor 61 since the potential of node E, which is the input to amplifier 65, is very close to the ground potential. All that is required to correct the VCR of resistor 61 is to apply to its epitaxial layer the potential $epi = \tfrac{1}{2} V_i +$ a constant.

This is done through resistor 63 whose value, 2R, is much higher than the input impedance, $Z_i$, of amplifier 60. In addition, resistor 63 permits applying to the epitaxial layer a DC voltage of approximate value $V_0/2$, for example 6 volts, intended to reverse bias, as has been seen, the various PN junctions 20 and 20' (FIG. 1) of the resistors whose VCR is to be corrected. Similarly, the VCR of resistor R2 is corrected by resistor 64.

FIG. 6B illustrates a different method of correcting the VCR of resistors R1 and R2 of the same linear amplifier 60 through the use of the particular technique described in connection with FIG. 3C. By dividing each of these resistors into three equal portions, 61', 61", 61'''and 62', 62", 62''', and by connecting the epitaxial layer of each of said portions to the most positive potential existing across each of them, the VCR of resistors R1 and R2 can be divided by three. In the latter case, $V_i$ must always be lower than $V_{ref}$.

In the case of the amplifiers shown in FIGS. 6A and 6B, the VCR of resistors R1 and R2 is corrected. The fact that such an input resistor R1 is available can prove useful in some applications. The amplifier gain is given by the ration of R2 to R1; this ratio is always independent of the VCR of the resistors, to the extent the resistors are formed in different isolation pockets.

While the invention has been particularly shown and described with reference to a preferred embodiment thereof, it will be understood by those skilled in the art that numerous changes in form and detail may be made therein without departing from the spirit and scope of the invention.

What is claimed is:

1. A resistor structure comprising:

a semiconductor body including a resistor region of a first conductivity type and located within an electrically isolated portion of a layer of opposite conductivity type, means for applying to one end of said resistor region a first potential and for applying to the other end of said resistor region a second potential, means for applying to said layer a single compensating potential having an instantaneous value which is a function of both of said first and second potentials so that the resistance of said resistor region remains approximately constant during variations of said first and second potentials, said compensating potential having an instantaneous value approximately equal to the instantaneous arithmetic mean value of said first and second potentials.

2. A resistor structure comprising:

a semiconductor body including a resistor region of a first conductivity type and located within an electrically isolated portion of a layer of opposite conductivity type, means for applying to one end of said resistor region a first potential and applying to the other end of said resistor region a second potential, means for generating a single compensating potential having an instantaneous value which is a function of both of said first and second potentials, means for applying to said layer said single compensating potential to maintain the resistance of said resistor region approximately constant in response to variations of said first and second potentials, and wherein said generating means generates a compensating potential which has an instantaneous value approximately equal to the instantaneous arithmetic mean value of said first and second potentials.

3. A resistor structure comprising:

a semiconductor body including a resistor region of a first conductivity type and located within an electrically isolated portion of a layer of opposite conductivity type, means for applying a first potential to one end of said resistor region and a second potential to the other end of said resistor region, means for generating a compensating potential having a value which is a function of said first and second potentials, means for applying to said layer said compensating potential, and wherein said compensating potential has a value approximately equal to the arithmetic mean value of said first and second potentials.

4. A resistor structure comprising:

a semiconductor body including a resistor region of a first conductivity type and located within an electrically isolated portion of a layer of opposite conductivity type, means for applying potentials to the opposite ends of said resistor region so that the potential difference across said region varies, and means for applying to said layer a potential which differs by a constant magnitude from the arithmetic mean value of the potentials applied to the ends of the resistor region.

* * * * *